United States Patent
Li et al.

(10) Patent No.: US 8,028,209 B2
(45) Date of Patent: Sep. 27, 2011

(54) SCALABLE SCAN SYSTEM FOR SYSTEM-ON-CHIP DESIGN

(75) Inventors: Wei Li, Austin, TX (US); Chih-Jen M. Lin, Austin, TX (US); Praveen Sathyanarayanan, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 12/493,050

(22) Filed: Jun. 26, 2009

(65) Prior Publication Data

US 2010/0332928 A1    Dec. 30, 2010

(51) Int. Cl.
*G01R 31/28* (2006.01)

(52) U.S. Cl. ........ 714/731; 714/707; 714/724; 714/726; 714/727; 714/729; 714/744; 714/742; 714/718; 365/201

(58) Field of Classification Search .......... None
See application file for complete search history.

(56) References Cited

U.S. PATENT DOCUMENTS

| | | | |
|---|---|---|---|
| 7,346,822 B2 * | 3/2008 | Warren et al. | 714/731 |
| 7,444,560 B2 * | 10/2008 | Nguyen et al. | 714/718 |
| 2005/0283696 A1 * | 12/2005 | Warren et al. | 714/742 |
| 2008/0005635 A1 * | 1/2008 | Kaibel et al. | 714/731 |
| 2008/0010573 A1 * | 1/2008 | Sul | 714/731 |
| 2010/0088561 A1 * | 4/2010 | Grise et al. | 714/731 |

* cited by examiner

*Primary Examiner* — John Trimmings
(74) *Attorney, Agent, or Firm* — Blakely, Sokoloff, Taylor & Zafman LLP

(57) ABSTRACT

A method and system to facilitate a scalable scan system in the design of a system-on-chip. In one embodiment of the invention, the system-on-chip includes a controller and one or more clock gating units. The clock gating unit is added to each unique clock domain of each function or logic block in the system-on-chip. By having a controller that connects to each clock gating unit and the scan input and output signals in each logic block of the SOC, this allows a scalable scan system in the design of the SOC and allows frequent block level design changes in the SOC without extensive changes to the scan logic in one embodiment of the invention. In addition, the scalable scan system also allows at-speed scan write-through testing of a memory array that can improve the scan test coverage of the system-on-chip.

19 Claims, 5 Drawing Sheets

SCALABLE SCAN SYSTEM FOR SYSTEM-ON-CHIP DESIGN

FIELD OF THE INVENTION

This invention relates to a system-on-chip, and more specifically but not exclusively, to a scalable scan system for a system-on-chip design.

BACKGROUND DESCRIPTION

In the design of a system-on-chip, there are several design methodologies such as design for test (DFT), design for manufacturing (DFM), and design for debug (DFD), collectively known as DFX, for example, that can be used to increase the testability, fault coverage and manufacturing yield of the system-on-chip. Scan insertion, or the conversion of flip-flops into scan flip-flops to form scan chains, is a common technique used in digital integrated circuit design to allow production testers to check for any manufacturing faults of the integrated circuit using the aid of the scan chains.

FIG. 1 illustrates a block diagram 100 of a prior art system-on-chip 105. The prior art system-on-chip 105 has a processor 110 with a clock (CLK) unit 112 that provides a CLK 114 to the logic block 1 120 and the logic block 2 130. The prior art system-on-chip 105 also has a CLK unit 160 that provides a CLK 162 to the logic block 3 140. The input/output (I/O) block 150 controls the external access(es) to the prior art system-on-chip 105.

However, for the design of the prior art system-on-chip 105, scan insertion poses a potential problem as the current scan insertion techniques are not scalable and any addition of extra scan blocks or chains during the end stages of the design requires extensive and time-consuming changes. The current scan testing technique often bypasses a memory array(s) in the logic blocks using the scan flip-flops. The scan flip-flops inserted to bypass the memory arrays not only require additional chip area, they also do not allow scan testing to be performed through the memory arrays.

BRIEF DESCRIPTION OF THE DRAWINGS

The features and advantages of embodiments of the invention will become apparent from the following detailed description of the subject matter in which.

DETAILED DESCRIPTION

Figure 1:
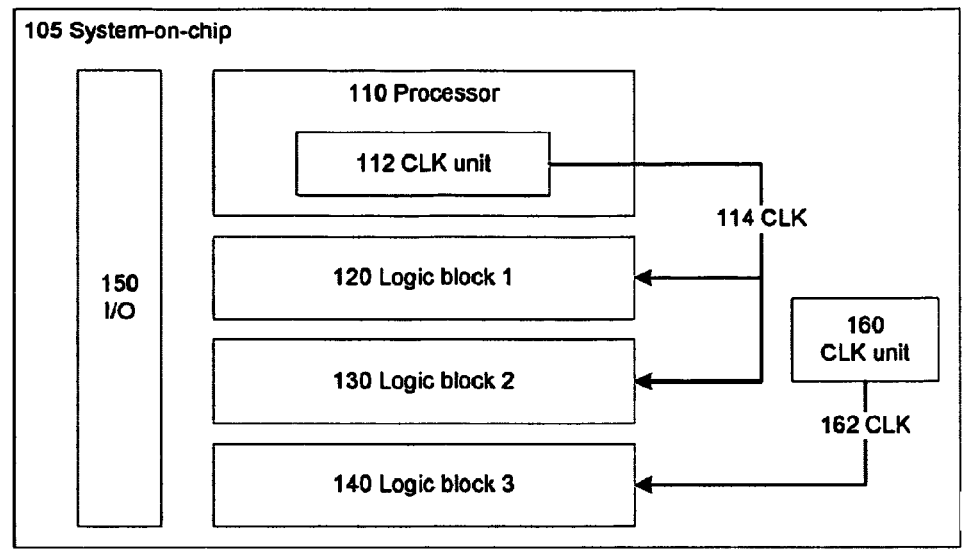
FIG. 1 illustrates a block diagram of a prior art system-on-chip.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to facilitate a scalable scan system in the design of a system-on-chip (SOC). In one embodiment of the invention, the SOC includes a controller and one or more clock gating units. The clock gating unit is added to each unique clock domain of each function or logic block in the SOC. When a new logic block with scan logic is to be added to the SOC, the clock gating unit is added or instantiated in the new logic block, and the clock gating unit in the new logic block is connected with the controller. The addition of the new logic block does not require changes to the scan logic in the other existing logic blocks in the SOC.

Similarly, when an existing logic block with scan logic is to be deleted from the SOC, the existing logic block can be removed from the SOC without affecting the scan logic in the other existing logic blocks in the SOC. By having a controller that connects to each clock gating unit and the scan input and output signals in each logic block of the SOC, this allows a scalable scan system in the design of the SOC and allows frequent block level design changes in the SOC without extensive changes to the scan logic in one embodiment of the invention.

Figure 2:
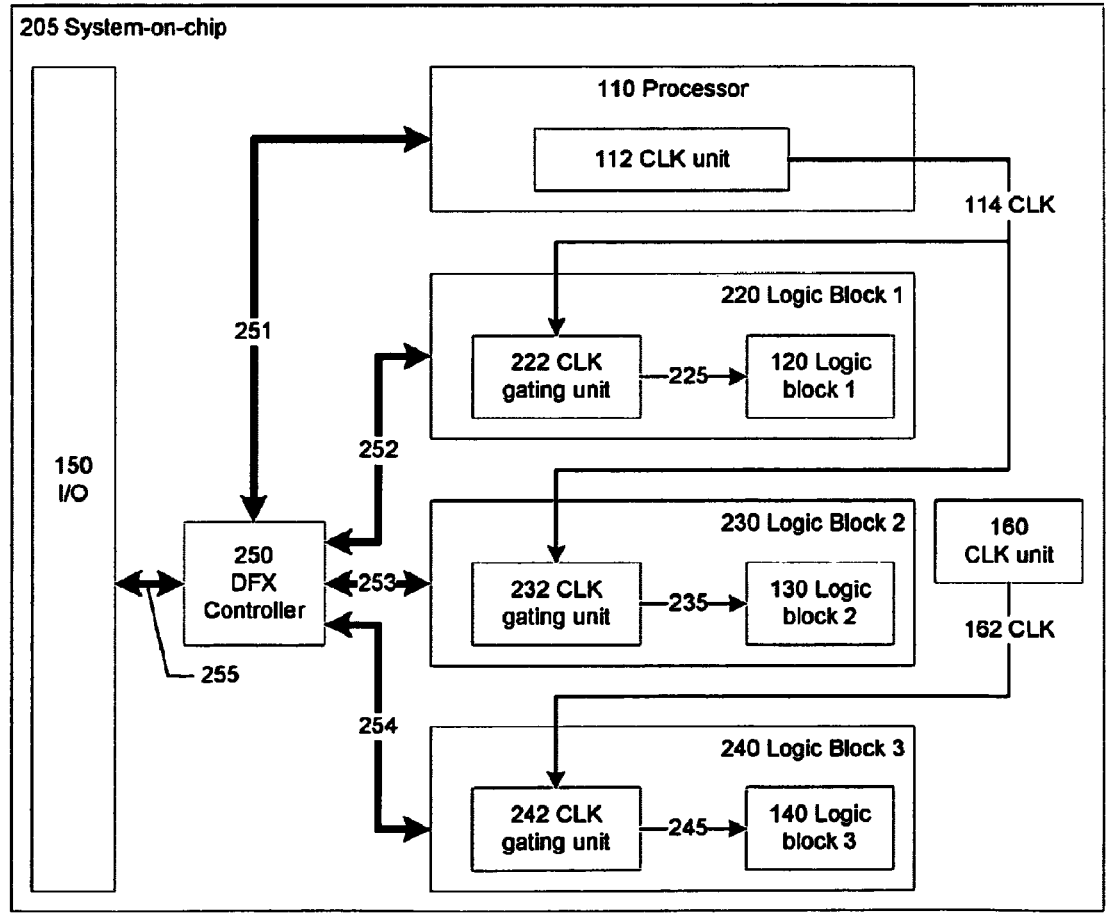
FIG. 2 illustrates a block diagram of a system-on-chip in accordance with one embodiment of the invention.

FIG. 2 illustrates a block diagram 200 of a system-on-chip 205 in accordance with one embodiment of the invention. The SOC 205 illustrates a scalable scan system that is added to the prior art SOC 105. The SOC 205 has a processor 110 with a CLK unit 112. In one embodiment of the invention, the processor 110 includes one or more processing cores and each core may include, but is not limited to, pre-fetch logic to fetch instructions, decode logic to decode the instructions, execution logic to execute the instructions and the like. In another embodiment of the invention, the SOC 205 includes two or more processors.

The CLK unit 112 includes, but is not limited to, one or more phase lock loops (PLLs), one or more oscillators, or any other clock generation circuit. The CLK unit 112 provides a CLK 114 to the logic block 1 220 and the logic block 2 230. The logic block 1 220 has a CLK gating unit/logic 222 coupled with the logic block 1 120. In one embodiment of the invention, the CLK gating unit 222 selects one of a scan clock, an at-speed clock and a functional clock as an input clock to the logic block 1 120. The CLK gating unit 222 provides the selected clock or gated clock 225 to the logic block 1 120 based on a mode setting of the SOC 205. For example, in one embodiment of the invention, the CLK gating unit 222 selects and provides the CLK 114 to the logic block 1 120 when the SOC 205 is in a functional or normal operational mode.

In one embodiment of the invention, the logic block 1 120 has scan logic that includes, but is not limited to, one or more chains of scan flip-flops to facilitate manufacturing fault testing of the logic block 1 120 during a scan mode of the SOC 205, test compression logic to compress the number of external scan input and output chains and the like. Each chain of the scan flip-flops has a common input clock and the scan flip-flips in each chain are coupled by coupling the output of one scan flip-flop to the input of another scan flip-flop. In one embodiment of the invention, the CLK gating unit 222 selects and provides a scan clock to the logic block 1 120 when the SOC 205 is in a scan shift mode.

In another embodiment of the invention, the CLK gating unit 222 selects and provides an at-speed clock to the logic block 1 120 when the SOC 205 is in a scan capture mode. The at-speed clock to the logic block 1 120 includes one or more sequential clock pulses of the at-speed functional clock signal to the logic block 1 120. For example, in one embodiment of the invention, the CLK gating unit 222 provides two sequential clock pulses or cycles of the CLK 114 to the logic block 1 120 during a scan capture mode of the SOC 205.

Both the scan shift mode and the scan capture mode are different phases of the scan mode of the SOC 205. In one embodiment of the invention, a scan mode signal and a scan enable signal are utilized to set the mode of the SOC 205. For example, in one embodiment of the invention, the SOC 205 is set in scan shift mode when both the scan mode signal and the scan enable signal are asserted. In another embodiment of the invention, the SOC 205 is set in scan capture mode when the scan mode signal is asserted and the scan enable signal is de-asserted. One of ordinary skill in the relevant art can utilize other logic combinations of the scan mode signal and the scan enable signal and/or use other signals to set the mode of the SOC 205 without affecting the workings of the invention.

The CLK gating units 232 and 242 in the logic block 2 230 and the logic block 3 240 respectively are similar to the CLK gating unit 222. The CLK gating units 232 and 242 are also able to select one of a scan clock, an at-speed clock and a functional clock as a input clock to the logic block 2 130 and the logic block 3 140 respectively. The CLK gating units 232 and 242 provide the gated clocks 235 and 245 respectively to the logic block 2 130 and the logic block 3 140 based on the mode setting of the SOC 205.

The DFX controller 250 is an interface among the I/O block 150, the logic blocks 220, 230, and 240 and the processor 110. The DFX controller 250 connects with the logic blocks 220, 230 and 240 via the interface signals 252, 253, and 254 respectively. The DFX controller 250 also connects with the I/O block 150 and the processor 110 via the interface signals 255, and 251 respectively. The I/O block 150 manages the external access(es) of the SOC 205 via external connections or pins, and the configuration of the external connections or pins. In one embodiment of the invention, the I/O block 150 configures the functionality or utility of the external connections or pins depending on the mode setting of the SOC 205. In one embodiment of the invention, the DFX controller 250 provides a scan shift clock to the CLK gating units 222, 232 and 242 when the SOC 205 is set in a scan mode.

In one embodiment of the invention, 205, the logic blocks 220, 230 and 240 include, but are not limited to, hard macros, soft macros, intellectual property (IP) blocks, and any other circuit with scan logic. Although the logic blocks 220, 230 and 240 are illustrated with only one clock input or clock domain, it is not meant to be limiting. Each logic block may have more than one clock domain in another embodiment of the invention. For each unique clock domain in the logic blocks 220, 230 and 240, a CLK gating unit is added to each unique clock domain in the logic blocks 220, 230 and 240.

The clock connections in the SOC 205 are illustrated as an example and it is not meant to be limiting. In other embodiments of the invention, the logic block 222 has its own clock generation circuit and does not need a clock input from the processor 110. The CLK unit 160 illustrates that the input clock of logic block 3 240 can be provided by an independent clock source. One of ordinary skill in the relevant art will readily appreciate that other configurations of the clock tree in the SOC 205 are applicable as well without affecting the workings of the invention.

Figure 3:
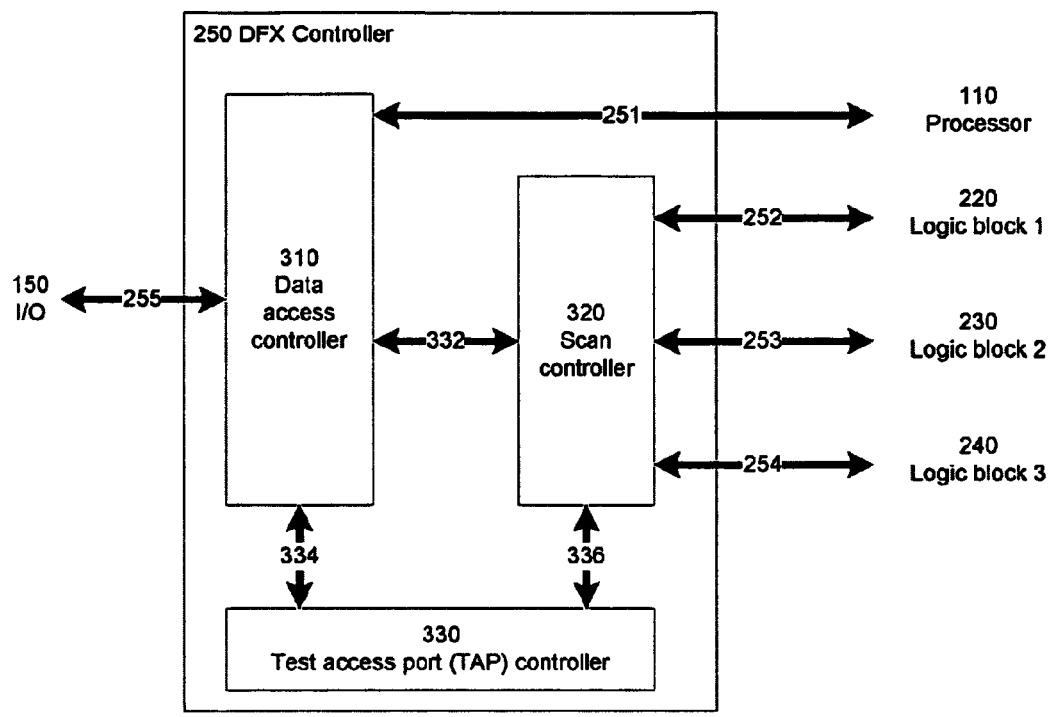
FIG. 3 illustrates a block diagram of the modules in a DFX controller in accordance with one embodiment of the invention.

FIG. 3 illustrates a block diagram 300 of the modules in a DFX controller 250 in accordance with one embodiment of the invention. The DFX controller 250 has a data access controller 310, a scan controller 320 and a test access port (TAP) controller 330. The data access controller 330 is coupled with the I/O block 150 to send and receive external signals to the SOC 205. In one embodiment of the invention, the data access controller 330 routes signals among the I/O block 150, the processor 110 and the scan controller 320 based on the mode setting of the SOC 205.

In one embodiment of the invention, the TAP controller 330 sends control/data signals to the data access controller 310 via the interface signals 334 based on the mode setting of the SOC 205. For example, in one embodiment of the invention, the TAP controller 330 has a register with mode setting bits to control the mode of the SOC 205. When the SOC 205 is to be configured or set into scan mode, the mode setting bits in the register in the TAP controller 330 are programmed to set the SOC 205 in a scan mode.

In one embodiment of the invention, the data access controller 310 routes signals including, but not limited to, scan chain input signals, scan chain output signals, scan mode signal, scan enable signal, and other scan related signals, to the scan controller 320 and the processor 110 when the SOC 330 is in scan mode. In one embodiment of the invention, the scan mode of the processor 110 and the logic blocks 220, 230, 240 are enabled simultaneously. In another embodiment of the invention, the scan mode of the processor 110 and the logic blocks 220, 230, 240 are enabled separately. The availability of the external pins or connections of the SOC 205 as scan chain input/output signals can be used to determine if the scan mode of the processor 110 and the logic blocks 220, 230, 240 are enabled simultaneously or separately.

The scan controller 320 is an interface between the data access controller 310 and the scan wrapper in each logic block 220, 230 and 240. The scan wrapper includes the interface logic to send and receive scan related signals such as scan chain input and output signals, scan enable signal, scan mode signal, for example. In one embodiment of the invention, the scan controller 320 sends the scan control and/or data signals from the data access controller 310 to the logic blocks 220, 230 and 240 based on a scan configuration of the logic blocks 220, 230 and 240. In one embodiment of the invention, all the scan chain input and output signals of the logic blocks 220, 230 and 240 are coupled with the scan controller 320. The TAP controller 320 provides the selection of the scan configuration to the scan controller 320 via the interface signals 336.

In one embodiment of the invention, the scan controller 320 supports three modes of scan operation. The three modes include a single block mode, a daisy mode, and a sub-daisy mode. In the single block mode of scan operation, the scan controller 320 selects one of the logic blocks 220, 230 and 240 for scan testing and the other unselected logic blocks are provided with a constant data (tied to logic high or low) to the scan chain input data signals when the selected logic block is being test. By keeping the input data constant for the scan chains in the unselected logic blocks, the switching activities in the unselected logic blocks are minimized.

In the daisy mode of scan operation, the scan chains of the logic blocks 220, 230 and 240 are concatenated or joined together. In one embodiment of the invention, the order of the connection of the scan chains in the logic blocks 220, 230 and 240 is based on the physical placement of each logic block in the SOC 205. For example, the scan controller 320 connects the external scan chain input data signals to the scan chain input data signals in the logic block 1 220 if the logic block 1 220 is physically located closest to the scan controller 320 in the floor plan of SOC 205. The scan chain output data signals in the logic block 1 220 are connected to the scan chain input data signals in the logic block 3 240 if the logic block 3 240 is physically located closest to the logic block 1 220. The scan chain output data signals in the logic block 3 240 are connected to the scan chain input data signals in the logic block 2 230 and the scan chain output signals in the logic block 2 230 are connected to the external scan chain output signals via the data access controller 310. In one embodiment of the invention, the scan control signals are coupled with all the logic blocks 220, 230 and 240.

In the sub-daisy mode of scan operation, only some of the scan chains in the logic blocks 220, 230 and 240 are concatenated together. For example, in one embodiment of the invention, the scan chains of the logic block 1 220 and the logic block 3 240 are concatenated together and the scan chains of the logic block 2 230 are connected directly to the scan controller 320. The choice of the mode of the scan operation of the SOC 205 depends on factors such as test time, test pattern count, test coverage, and the like, of the SOC 205 in one embodiment of the invention. One of ordinary skill in the relevant art will readily appreciate that other methods of the functional partitioning of the modules in DFX controller 250 can be used without affecting the workings of the invention. For example, in one embodiment of the invention, the data access controller 310 and scan controller 320 are combined into a single module.

Figure 4:
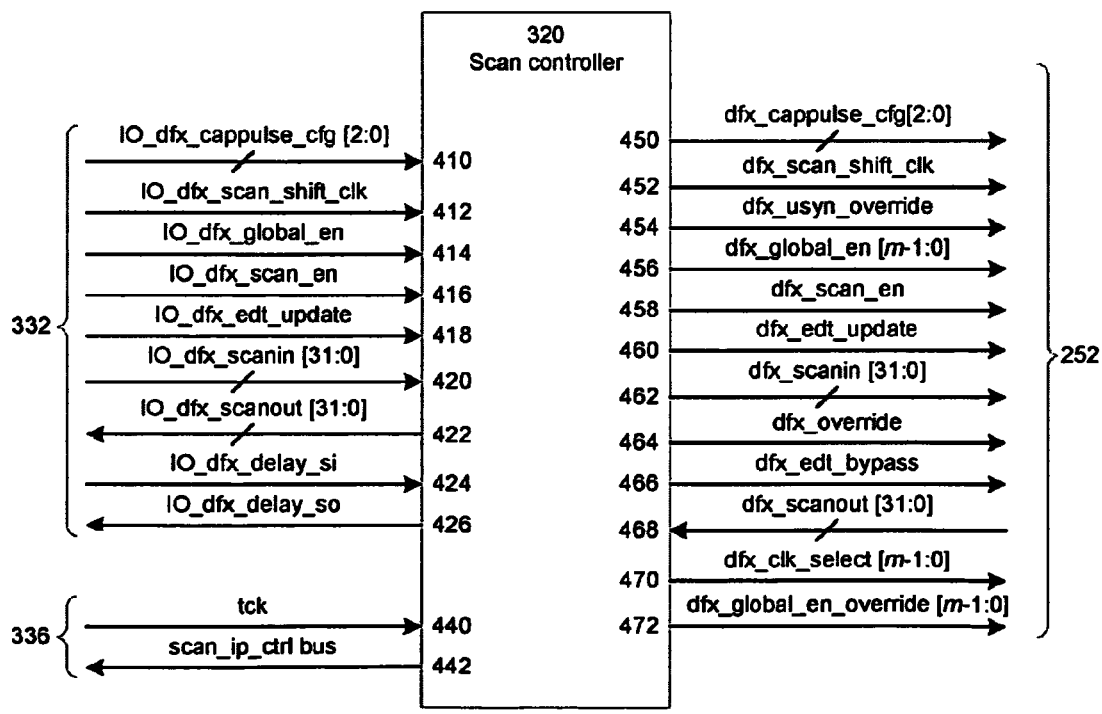
FIG. 4 illustrates the connections of a scan controller in accordance with one embodiment of the invention.

FIG. 4 illustrates the connections 400 of a scan controller 320 in accordance with one embodiment of the invention. The connections 400 are illustrated as an example of one implementation of one embodiment of the invention and it is not meant to be limiting. In other embodiments of the invention, different variations of the connections can be used without affecting the workings of the invention. For clarity of illustration, the connections 400 only show the interface signals 252 between the scan controller 320 and the logic block 1 220. The interface signals 253 and 254 between the scan controller 320 and the logic blocks 230 and 240 respectively are similar to the interface signals 252 between the scan controller 320 and the logic block 1 220 and therefore are not repeated herein.

The interface signals 336 show the connections between the data access controller 310 and the TAP controller 330 in one embodiment of the invention. The interface signals 336 include, but are not limited to, the tck signal 440 and the scan_ip_ctrl_bus 442. The interface signals 332 show the connections between the data access controller 310 and the scan controller 320 in one embodiment of the invention. The IO_dfx_cappulse_cfg [2:0] signals 410 indicate the number of at-speed clock pulses that are provided during the scan capture mode of the SOC 205. Although the IO_dfx_cappulse_cfg [2:0] signals 410 have only have three bits to represent a maximum number of eight at-speed clock pulses that can be generated, it is not meant to be limiting. In another embodiment of the invention, more than eight at-speed clock pulses can be generated and more bits can be added to the IO_dfx_cappulse_cfg [2:0] signals 410 to indicate more than eight at-speed clock pulses that are provided during the scan capture mode of the SOC 205.

The IO_dfx_scan_shift_clk signal 412 provides a scan shift clock to the scan controller 320. The IO_dfx_global_en signal 414 is used as a trigger signal for the at-speed clock pulses or cycles. The IO_dfx_scan_en signal 416 provides a scan enable signal to the scan controller 320. In the illustration of FIG. 4, the logic block 1 220 has test compression logic and the IO_dfx_edt_update signal 418 indicates to the logic block 1 220 to update the test compression logic. The IO_dfx_scanin [31:0] signals 420 is a thirty-two bits width scan chain input data bus and the IO_dfx_scanout [31:0] signals 422 is a thirty-two bits width scan chain output data bus in one embodiment of the invention. In another embodiment of the invention, the bus width of the scan chain input data bus and scan chain output data bus can be more than or less than thirty-two bits. The IO_dfx_delay_si signal 424 is the input data signal of a dfx_global_enable delay configuration chain and the IO_dfx_delay_so signal 426 is the output of the dfx_global_enable delay configuration chain.

The interface signals 252 show the connections between the scan controller 320 and the logic block 1 220 in one embodiment of the invention. The scan controller 320 forwards the IO_dfx_cappulse_cfg [2:0] signals 410, IO_dfx_scan_shift_clk signal 412, IO_dfx_scan_en signal 416, IO_dfx_edt_update signal 418, IO_dfx_scanin [31:0] 420, dfx_IO_scanout [31:0] signals 422 from the data access controller 310 as dfx_cappulse_cfg [2:0] signals 450, dfx_scan_shift_clk signal 452, dfx_scan_en signal 458, dfx_edt_update signal 460, dfx_scanin [31:0] signals 462, and dfx_scanout [31:0] signals 468 respectively to the logic block 1 220.

In another embodiment of the invention, the scan controller 320 is able to turn off or gate off the dfx_scan_shift_clk signal 452 to the logic block 1 220 based on a register bit setting. The scan controller 320 also has the ability to enable or disable the shift clock signal to each of the other logic blocks 230 and 240. In one embodiment of the invention, the dfx_scan_shift_clk signal 452 is generated by first intercepting IO_dfx_scan_shift_clk 412 and the tck signal 440. The dfx_scan_shift_clk signal 452 is activated based on the scan configuration of the SOC 205.

The dfx_usync_override signal 454 indicates whether to shut off the functional clocks to the logic block 1 220 on the edge of a universal sync signal. In one embodiment of the invention, all functional clocks to the logic block 1 220 are shut off or gated off on the same edge of universal sync to facilitate a scan for debug mode of the SOC 205. However, if the dfx_usync_override signal 454 is set or asserted, the functional clocks to the logic block 1 220 are shut off immediately without considering the universal sync signal.

In one embodiment of the invention, the logic block 1 220 has more than one clock domain. For each unique clock domain, a CLK gating unit 222 is added to provide clock gating selection logic. In the illustration of FIG. 4, the logic block 1 220 is assumed to have m unique clock domains. Each of the dfx_global_en [m−1:0] signals 456 are connected with each of the m unique clock domains. In normal functional mode of the SOC 205, the dfx_global_en [m−1:0] signals 456 are provided to the scan controller 320 by the TAP controller 330 via the interface signals 336. In the scan mode of the SOC 205, the dfx_global_en [m−1:0] signals 456 are triggered by the IO_dfx_global_en signal 414. In one embodiment of the invention, the scan controller 320 has an internal delay network to ensure non-overlapping capture clocks when multiple clock domains are targeted during scan testing. The interval of the capture clocks in the different clock domains can be programmed either through I/O access or through the TAP controller 330.

In another embodiment of the invention, the dfx_scan_en signal 458 can be gated off by the scan controller 320 based on a register bit setting in the scan controller 320. The scan controller 320 controls the dfx_scan_en signal 458 for each of the logic blocks 220, 230 and 240 in one embodiment of the invention. The dfx_override signal 464 is provided to a functional CLK gating module in the CLK gating unit 222. The dfx_edt_bypass signal 466 bypasses the test compression logic in the logic block 1 220 when asserted. Each signal of the dfx_clk_select [m−1:0] signals 470 is connected to a respective one of the CLK gating unit of the m unique clock domains of the logic block 1 220. Each signal of the dfx_clk_select [m−1:0] signals 470 can shut off the respective functional clock individually. The dfx_global_en_override [m−1:0] signals 472 can be used to control the generation of at-speed clock pulse(s). When any signal in the dfx_global_en_override [m−1:0] signals 472 is asserted, the CLK gating unit 222 coupled to the asserted signal disables the generation of at-speed clock pulse(s).

Figure 5A:
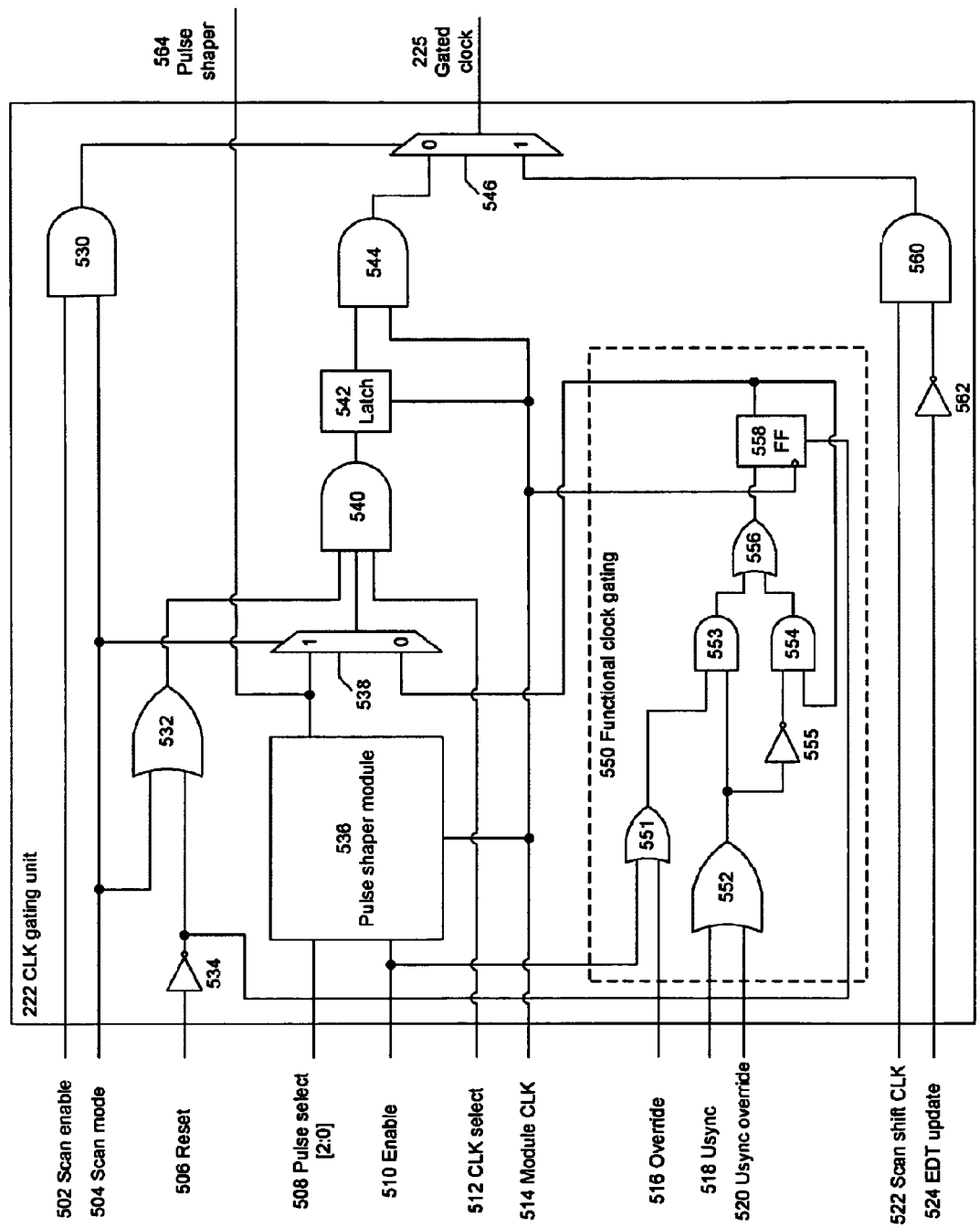
FIG. 5A illustrates a circuit diagram of a clock gating unit in accordance with one embodiment of the invention.

FIG. 5A illustrates a circuit diagram 500 of a CLK gating unit 222 in accordance with one embodiment of the invention. The CLK gating unit 222 has two multiplexers 538 and 546 to select one CLK among a module CLK 514, an at-speed clock and a scan shift CLK 522 as the gated clock 225 to the logic block 1 120. The multiplexer 546 is controlled using an output of a two inputs AND gate 530. The scan enable signal 502 and scan mode signal 504 connect to the two inputs to the AND gate 530 in one embodiment of the invention. When both the scan enable signal 502 and the scan mode signal 504 are asserted, the multiplexer 546 selects the logic "1" input as the gated clock 225. In one embodiment of the invention, the scan enable signal 502 is the dfx_scan_en signal 458 provided by the scan controller 320.

The logic "1" input of the multiplexer 546 is connected to a two inputs AND gate 560. The scan shift CLK signal 522 connects to one input to the AND gate 560 and the EDT update signal 524 connects to the other input to the AND gate 560 via an inverter 562. When both the scan enable signal 502 and the scan mode signal 504 are asserted, and the EDT update signal 524 is de-asserted, the CLK gating unit 222 selects the scan shift CLK signal 522 as the gated clock 225 to the logic block 1 120 in one embodiment of the invention. In another embodiment of the invention, the logic block 1 120 does not have test compression logic and the EDT update signal 524 is not required and the scan shift CLK 522 is connected directly to the logic "1" input of the multiplexer 546. In one embodiment of the invention, the scan shift CLK 522 and the EDT update signal 524 are the dfx_scan_shift_clk signal 452 and the dfx_edt_update signal 460 respectively provided by the scan controller 320.

When either the scan enable signal 502 or the scan mode signal 504 is de-asserted, the output of the AND gate 530 de-asserts the multiplexer 546 and the CLK gating unit 222 selects the logic "0" input of the multiplexer 546 as the gated clock 225 to the logic block 1 120. The logic "0" input of the multiplexer 546 is connected with the output of a two input AND gate 544. The output of the latch 542 provides the first input to the AND gate 544 and the module CLK 514 provides the second input to the AND gate 544. The AND gate 544 effectively gates the module CLK 514 based on the output signal of the latch 542. The input signal to the latch 542 is latched as the output signal when the module CLK 514 is asserted.

The input signal to the latch 542 is connected to the output of a three inputs AND gate 540. The CLK select signal 512 connects to one of the inputs of the AND gate 540 and disables the AND gate 540 when the CLK select signal 512 is de-asserted. In embodiment of the invention, the CLK select signal 512 is one of the dfx_clk_select [m−1:0] signals 470 provided by the scan controller 320.

One of the inputs of the AND gate 540 is connected to the output of an OR gate 532. The scan mode signal 504 is connected to one input of the OR gate 532 and the reset signal 506 is connected via an inverter 534 to the other input of the OR gate 532. When the scan mode signal 504 is asserted and/or the reset signal 506 is de-asserted, the output of the OR gate 532 is asserted.

One of the inputs of the AND gate 540 is connected to the output of the multiplexer 538. The multiplexer 538 is controlled by the scan mode signal 504 and when the scan mode signal 504 is asserted, the multiplexer 538 selects the logic "1" input that is connected with a pulse shaper module 536. The pulse shaper module 536 generates a pulse shaper signal that can control the number of at-speed clock pulses of the module CLK 514 to be provided to the logic block 1 120. The pulse shaper module has pulse select [2:0] signals 508 to select the number of at-speed pulses of the module CLK 514 to be generated. The enable signal 510 is used as a trigger to generate the desired pulse shaper signal.

In one embodiment of the invention, the CLK gating unit 222 allows one or more at-speed clock pulses of the module CLK 514 to pass through as the gated clock 225. For example, in one embodiment of the invention, when the scan mode signal 504 is asserted, the multiplexer 538 selects the output of the pulse shaper module 536 to pass through to the AND gate 540. When the CLK select signal 512 is also asserted, the output of the AND gate 540 is dependent only on the output of the pulse shaper module 536 since the two other inputs to the AND gate 540 are asserted. The pulse shaper module 536 generates a pulse shaper signal of a desired pulse width and the pulse shaper signal passes through the multiplexer to the AND gate 540 and to the latch 542. The latch 542 passes the pulse shaper signal to the AND gate 544 when the module CLK 514 is asserted.

Therefore, depending on the pulse width of the pulse shaper signal, the number of at-speed clock cycles of the module CLK 514 to pass through as the gated clock 225 can be controlled. For example, if the pulse select [2:0] signals 508 are set to three, the generated pulse width of the pulse shaper signal is of three clock cycles of the module CLK 514. The pulse shaper signal allows only three clock cycles of the module CLK 514 to pass through the AND gate 544 and through the multiplexer 546 as the gated clock 225 when the scan enable signal 502 is asserted. In one embodiment of the invention, the pulse select [2:0] signals 508 are the dfx_cap_pulse_cfg [2:0] signals 450 provided by the scan controller 320. The enable signal 510 is one of the respective dfx_global_en [m−1:0] signals 456.

When the SOC 205 is in normal functional mode, the scan mode signal 504, the scan enable signal 502 and the reset signal 506 are de-asserted and both the multiplexers 546 and 538 select their logic "0" input. The logic "0" input of the multiplexer 538 is connected to the output of a functional clock gating module 550. The output of the functional clock gating module 550 effectively controls or gates the module CLK 514 as the gated clock 225. For example, when the output of the functional clock gating module 550 is de-asserted, the multiplexer 538 in turn de-asserts the output of AND gate 540. Since the output of AND gate 540 is de-asserted, the latch 542 de-asserts the AND gate 544 and therefore, the module CLK 514 is unable to pass through AND 544 to the multiplexer 546 as the gated clock 225.

Similarly, when the output of the functional clock gating module 550 is asserted, the multiplexer 538 asserts the input of the AND gate 540 that is connected with the multiplexer. The CLK select signal 512 is asserted in a normal functional mode of the SOC 205 and asserts the input to the AND gate 540 that is connected with the CLK select signal 512. Since the reset signal 506 is de-asserted, the inverter 534 inverts the reset signal 506 and asserts the output signal of the OR gate 532. Therefore, the last input of AND gate 540 is also asserted. Since all the three inputs of the AND gate 540 are asserted, the output of the AND gate 540 is asserted and it in turn asserts the latch 542 and one of the inputs of the AND gate 544. Therefore, the module CLK 514 is allowed to pass through the AND gate 544 and reaches the multiplexer 546 and becomes the gated clock 225.

The functional clock gating module 550 has five input signals that include the override signal 516, the usync signal 518, the usync override signal 520, the enable signal 510 and the reset signal 506. In normal functional mode of the SOC 205, the enable signal 510 is also de-asserted. When the override signal 516, the usync signal 518, and the usync override signal 520 are de-asserted, the output of the OR gate 551 is de-asserted since the enable signal 510 and the override signal 516 are de-asserted. The output of the OR gate 551 is connected to the input of the AND gate 553. Since the output of the OR gate 551 is de-asserted, the AND gate 553 is de-asserted as well. The output of the OR gate 552 is also de-asserted as both the usync signal 518 and the usync override signal 520 are de-asserted.

The output of the OR gate 552 is inverted via the inverter 555 and it goes to one of the inputs of the AND gate 554. One of the inputs of the AND gate 554 is asserted by the output of the inverter 555 and the other input is fed back from the output of the flip-flop 558. The flip-flop 558 has an asserted output signal when it is reset by the reset signal 506. Since the output of the flip-flop 558 is asserted and is fed back to the input of AND gate 554, the output of AND gate 554 is asserted and the output of the OR gate 556 is asserted as well. The input of the flip-flop 558 sees an asserted signal and the output of the flip-flip 558 is asserted when the module CLK 514 toggles. This allows the module CLK 514 to pass through as the gated clock 225 to the logic block 120.

When the usync signal 518 is asserted, the OR gate 552 is asserted and the AND gate 554 is de-asserted as a result. When the output of the AND gate 554 is de-asserted, the input of the OR gate 556 is also de-asserted and it in turn causes the flip-flop 558 to de-assert its output signal to the multiplexer 538. This effectively gates off the module clock 514 as the gated clock 225. When usync override signal 520 is asserted, the state of the usync signal 518 does not matter as the output of the flip-flop 558 will always be de-asserted and the module CLK 514 is gated off.

The override signal 516 provides a way to override the usync override signal 520 as when the override signal 516 is asserted when the usync override signal 520 is also asserted. The output of the flip-flop 558 is asserted when both the override signal 516 and the usync override signal 520 are asserted. In one embodiment of the invention, the override signal 516 and usync override signal 520 are the dfx_override signal 464, and the dfx_usyn_override 454 from the scan controller 320.

The circuit 500 illustrated in FIG. 5A is not meant to be limiting. One of ordinary skill in the relevant art can use alternative circuit or logic to implement the same functionality of the CLK gating unit 222 without affecting the workings of the invention. For example, in another embodiment of the invention, the AND gates 530, 540, 544, 553, 554, and 560 are replaced by NAND gates and additional logic or circuit may be added to ensure the same functionality of the clock gating unit 222 by the replacement of the AND gates 530, 540, 544, 553, 554, and 560.

Figure 5B:
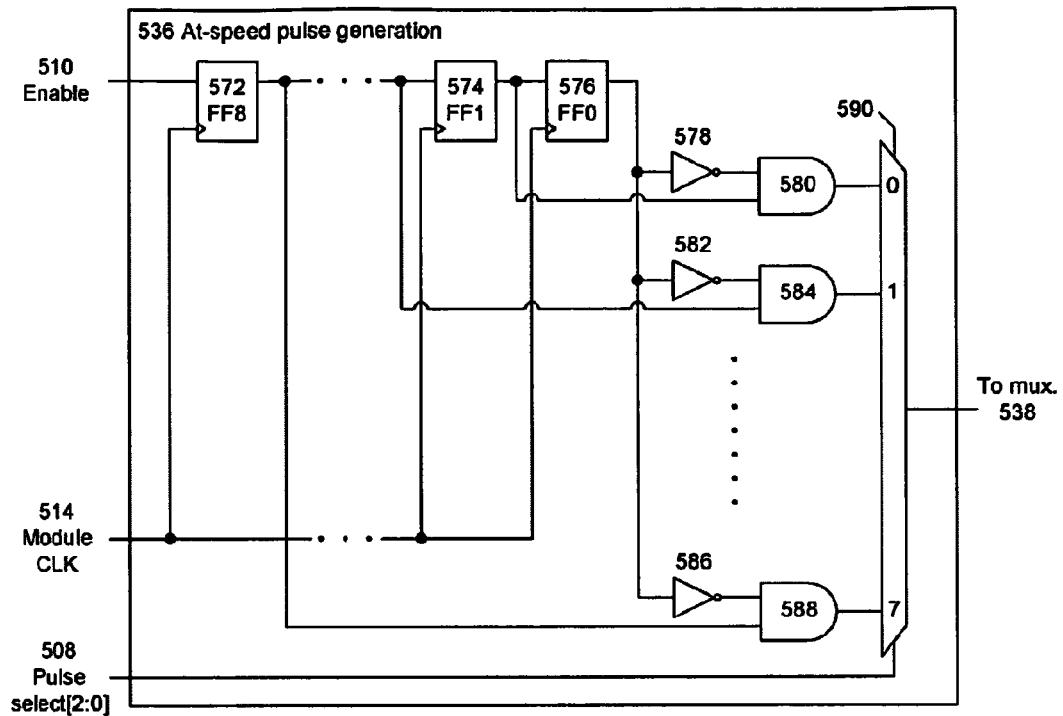
FIG. 5B illustrates a circuit diagram of a pulse shaper module in accordance with one embodiment of the invention.

FIG. 5B illustrates a circuit diagram 570 of a pulse shaper module 536 in accordance with one embodiment of the invention. In one embodiment of the invention, there are three inputs to the pulse shaper module 536 that includes the enable signal 510, the module CLK 514, and the pulse select [2:0] signals 508. The pulse shaper module 536 is able to generate a pulse shaper signal of width that ranges from one to eight clock cycles of the module CLK 514 based on the pulse select [2:0] signals 508. The pulse select [2:0] signals 508 controls the selection of the multiplexer 590 and the enable signal 510 can trigger a pulse shaper signal of a width between one to eight at-speed clock pulses of the module CLK 514. One of ordinary skill in the relevant art will readily appreciate the workings of the circuit 536 and therefore the workings are not described in detail.

The addition of the DFX controller 250 and the clock gating units in each logic block 220, 230, and 240 to the SOC 205 allows an easy implementation of at-speed scan capture CLK generation, deterministic function CLK gating, at-speed scan shifting with a single clock tree in the SOC 205. The SOC 205 can support both launch-off-capture and launch-off-shift transition scan test and it can generate multiple consecutive at-speed scan capture clocks to penetrate the paths through the non-scan area in the block such as memory arrays.

Memory arrays are frequently used in logic blocks to store execution data or firmware. The memory arrays include, but is not limited to, Synchronous Dynamic Random Access Memory (SDRAM), Dynamic Random Access Memory (DRAM), RAMBUS Dynamic Random Access Memory (RDRAM), NAND flash memory, phase change memory (PCM), read only memory (ROM), electrically erasable programmable read only memory (EEPROM), or any other type of volatile or non-volatile memory.

Figure 6:
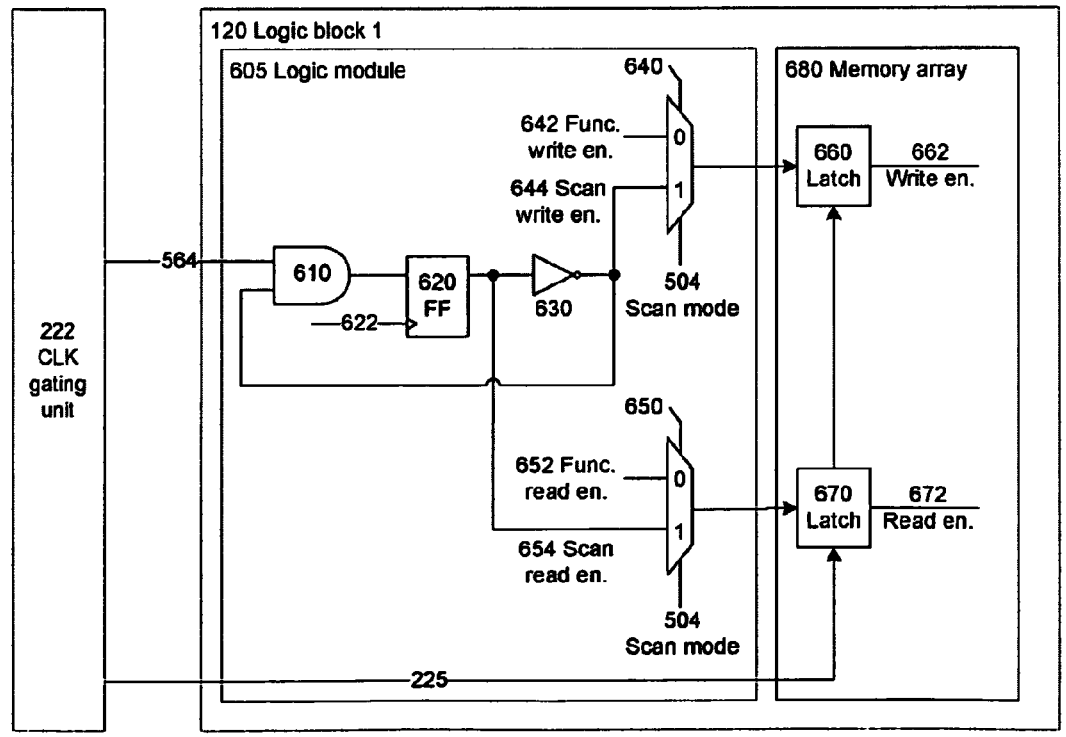
FIG. 6 illustrates a circuit diagram of a logic module to facilitate write-through scan testing of a memory array in accordance with one embodiment of the invention.

FIG. 6 illustrates a circuit diagram 600 of a logic module 605 to facilitate write-through scan testing of a memory array 680 in accordance with one embodiment of the invention. The circuit diagram 600 shows a logic block 1 120 that has a logic module 605 to prevent contention of a write access and a read access to a memory array 680 in one embodiment of the invention. The CLK gating unit 222 provides the pulse shaper signal 564 and the gated clock 225 to the logic block 1 120.

The pulse shaper signal 564 is connected with one of the inputs of the AND gate 610. The other input of the AND gate 610 is connected with the output of an inverter 630. The output of the AND gate 610 is connected with the input of flip-flop 620. The flip-flop 620 is clocked by the module CLK 514 of the logic block 1 120 and the output of the flip-flop 620 is connected to the input of the inverter 630. The multiplexers 640 and 650 control the selection of the write enable signal 662 and the read enable signal 672 respectively. Both multiplexers 650 and 650 are controlled by the scan mode signal 504.

When the scan mode signal 504 is de-asserted, the multiplexers 640 and 650 select the functional write enable signal 642 and the functional read enable signal 652 respectively as the input to the latches 660 and 670. When the scan mode signal 504 is asserted, the multiplexers 640 and 650 select the scan write enable signal 644 and scan read enable signal 654 respectively as the input to the latches 660 and 670. The latches 660 and 670 latches the output signal of the multiplexers 640 and 650 as the write enable signal 662 and read enable signal 672 to the memory array 680.

The logic module 605 generates sequentially the write enable signal 662 and the read enable signal 672 to the memory array 680. This facilitates writing data to a particular address of the memory array 680 when the write enable signal 662 is asserted and reading the data from the particular address of the memory array 680 when the read enable signal 672 is asserted. In a single port memory array, a scan pattern generation tool may be unable to have an accurate understanding of the functionality of the single port memory and may generate parallel read and write access to a particular address of the memory array. This causes an error, as the single port memory array is unable to support parallel read and write accesses.

The logic module 605 provides a simple solution to ensure that there is no contention of any read or write access to the memory array 680. It also provides an efficient way to conduct scan testing through the memory array 680 and therefore improves the scan test coverage of the logic block 1 120 significantly. In addition, as many at-speed paths in the SOC 205 go through the memory arrays, the logic module 605 facilitates catching delay faults in the logic block 1 120 and have significant impact on the final defect per million (DPM) of the SOC 205. The logic module 605 has minimal hardware overhead and can be easily integrated into the design of a SOC.

Figure 7:
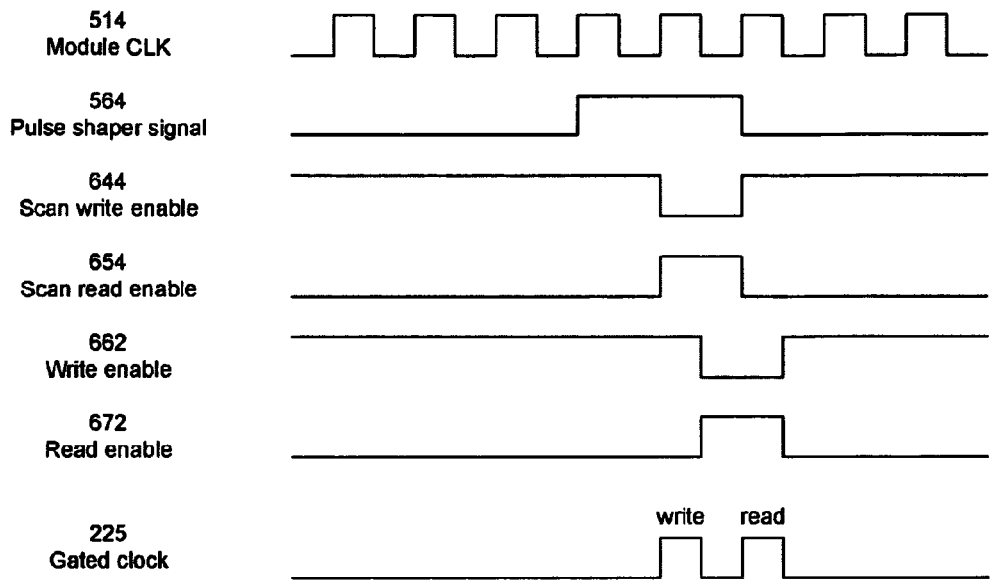
FIG. 7 illustrates a timing diagram of the signals in the logic module in accordance with one embodiment of the invention.

FIG. 7 illustrates a timing diagram 700 of the signals in the logic module 605 in accordance with one embodiment of the invention. For clarity of illustration, FIG. 7 is described with the aid of FIG. 6. The module CLK 514 is illustrated as a free running clock and the module CLK 514 is provided to the flip-flop 620. The CLK gating unit 222 provides a pulse shaper signal 564. The example described in FIG. 7 illustrates a pulse shaper signal 564 that has a width of two clock cycles of the module CLK 514. In one embodiment of the invention, the pulse shaper signal 564 triggers the scan write enable signal 644 and the scan read enable 654 sequentially.

In the first cycle of the pulse shaper signal 564, the scan write enable signal 644 is asserted while the scan read enable signal 654 is de-asserted. In the second cycle of the pulse shaper signal 564, the scan write enable signal 644 is de-asserted while scan read enable signal 654 is asserted. The clock gating unit 222 provides two at-speed module CLK cycles via gated clock 225 and allows the scan test data to be written to a particular address in the first cycle and the same data is read out from the particular address in the second cycle. The write enable signal 662 and the read enable signal 672 has a delay of half clock cycle of the module CLK 514 due the latches 660 and 670. In addition, in another embodiment of the invention, more than two at-speed module CLK cycles can be provided to allow consecutive memory array scan write-through operation to boost the test coverage even further with the same logic module 605. For example, in one embodiment of the invention, the CLK gating unit 222 provides four at-speed module CLK cycles to allow a sequence of write, read, write, and read access to the memory array 680.

In one embodiment of the invention, the logic module 605 facilitates the generation of at-speed scan test patterns to detect faults through the memory arrays. In addition, the logic module 605 does not have any limit on arrays connections and it can handle the scenario where the output of one memory array feeds the input of another memory array. With logic module 605, conducting scan test to exercise key paths through the memory arrays can be performed with minimal hardware cost, and it allows the screening out of many speed related defects along those paths as well as those defects around inputs and outputs of the memory arrays and therefore, improve the quality of the SOC 205 significantly.

Figure 8:
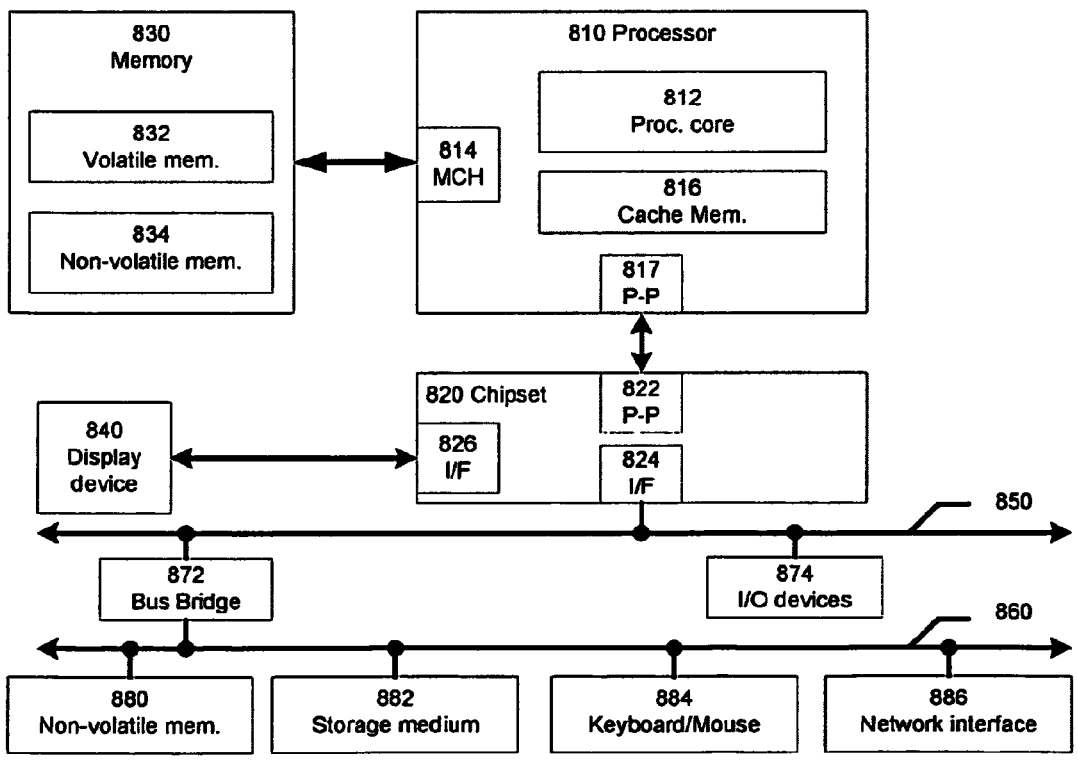
FIG. 8 illustrates a system to implement the methods disclosed herein in accordance with one embodiment of the invention.

FIG. 8 illustrates a system 800 to implement the methods disclosed herein in accordance with one embodiment of the invention. The system 800 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 800 used to implement the methods disclosed herein may be a SOC.

The processor 810 has a processing core 812 to execute instructions of the system 800. The processing core 812 includes, but is not limited to, pre-fetch logic to fetch instructions, decode logic to decode the instructions, execution logic to execute instructions and the like. The processor 810 has a cache memory 816 to cache instructions and/or data of the system 800. In another embodiment of the invention, the cache memory 816 includes, but is not limited to, level one, level two and level three, cache memory or any other configuration of the cache memory within the processor 810.

The memory control hub (MCH) 814 performs functions that enable the processor 810 to access and communicate with a memory 830 that includes a volatile memory 832 and/or a non-volatile memory 834. The volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 834 includes, but is not limited to, NAND flash memory, phase change memory (PCM), read only memory (ROM), electrically erasable programmable read only memory (EEPROM), or any other type of non-volatile memory device. The memory 830 stores information and instructions to be executed by the processor 810. The memory 830 may also stores temporary variables or other intermediate information while the processor 810 is executing instructions.

The chipset 820 connects with the processor 810 via Point-to-Point (PtP) interfaces 817 and 822. The chipset 820 enables the processor 810 to connect to other modules in the system 800. In one embodiment of the invention, the interfaces 817 and 822 operate in accordance with a PtP communication protocol such as the Intel® QuickPath Interconnect (QPI) or the like. The chipset 820 connects to a display device 840 that includes, but is not limited to, liquid crystal display (LCD), cathode ray tube (CRT) display, or any other form of visual display device.

In addition, the chipset 820 connects to one or more buses 850 and 860 that interconnect the various modules 874, 880, 882, 884, and 886. Buses 850 and 860 may be interconnected together via a bus bridge 872 if there is a mismatch in bus speed or communication protocol. The chipset 820 couples with, but is not limited to, a non-volatile memory 880, a storage medium 882, a keyboard/mouse 884 and a network interface 886. The storage medium 882 includes, but is not limited to, a solid state drive, a hard disk drive, an universal serial bus flash memory drive, or any other form of computer data storage medium. The network interface 886 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the Institute of Electrical and Electronics Engineers (IEEE) wireless standard family 802.11, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although the cache memory 816 is depicted as a separate block within the processor 810, the cache memory 816 can be incorporated into the processor core 812 respectively. The system 800 may include more than one processor/processing core in another embodiment of the invention. In addition, there are other functional blocks or more instances of each block that can be connected in system 800 that are not shown.

Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus comprising:
   one or more logic blocks;
   clock gating logic coupled with the one or more logic blocks to select one of a scan clock, an at-speed clock and a functional clock as an input clock to the one or more logic blocks;
   one or more memory blocks, wherein the clock gating logic is coupled with the one or more memory blocks to select one of the scan clock, the at-speed clock and the functional clock as another input clock to the one or more memory blocks; and
   one or more access logic blocks, each access logic block coupled with the clock gating logic and a respective one of the one or more memory blocks to facilitate one or more sequential pairs of a write enable signal and a read enable signal to the respective memory block using at least in part, a pulse from the clock gating logic.

2. The apparatus of claim 1, wherein the clock gating logic comprises a functional clock gating logic, and wherein the functional clock gating logic is to disable the functional clock responsive to a received selection signal.

3. The apparatus of claim 1, wherein each logic block comprises one or more scan chains responsive to a setting of the apparatus in a scan mode, and wherein the clock gating logic is further to provide the selected scan clock or the selected at-speed clock to the one or more scan chains in each logic block.

4. The apparatus of claim 1, wherein the clock gating logic to select one of the scan clock, the at-speed clock and the functional clock as the input clock to the one or more logic blocks is to select one of the scan clock, the at-speed clock and the functional clock as the input clock to the one or more logic blocks based at least in part on a received scan mode signal and a received scan enable signal.

5. The apparatus of claim 1, wherein the clock gating logic comprises a circuit to generate the pulse, wherein the pulse is to have a width of one or more clock cycles of the functional clock, and wherein the clock gating logic is further to gate the functional clock with the pulse to obtain the at-speed clock.

6. The apparatus of claim 1, wherein the one or more logic blocks are to run on a first clock domain, the apparatus further comprising:
   another one or more logic blocks to run on a second clock domain; and
   another clock gating logic coupled with the other one or more logic blocks to select one of another scan clock, another at-speed clock and another functional clock as an input clock to the other one or more logic blocks.

7. A system comprising:
   one or more memory arrays;
   a clock unit to provide a pulse shaper signal to each memory array; and
   one or more logic units, each logic unit coupled with the clock unit and a respective one of the one or more memory arrays, wherein each logic unit is to prevent contention of a write access and a read access to the respective one memory array using at least in part, the pulse shaper signal.

8. The system of claim 7, wherein each logic unit to prevent the contention of the write access and the read access to the respective one memory array is to facilitate the write access and the read access sequentially to the respective one memory array.

9. The system of claim 7, wherein the clock unit is further to provide a gated clock to each memory array, and wherein the gated clock comprises one of a scan clock, an at-speed clock, and a module clock.

10. The system of claim 9, wherein the clock unit comprises a pulse shaper module having a selection input to provide the pulse shaper signal to each memory array, and wherein a width of pulse shaper signal is set to one or more clock cycles of the module clock based on the selection input.

11. The system of claim 9, wherein the clock unit is to generate the at-speed clock using at least in part, the pulse shaper signal and the module clock.

12. The system of claim 9, wherein each memory array comprises a read latch and a write latch, wherein the write latch is coupled with the selection logic and with the clock unit to receive the gated clock, and wherein the read latch is coupled the other selection logic and with the clock unit to receive the gated clock.

13. The system of claim 9 further comprising:
a scan controller to provide the scan clock; and
one or more modules, each module comprising:
one or more scan chains, wherein an input and an output of each scan chain is coupled with the scan controller; and
another clock unit to select one of the scan clock, another at-speed clock and another functional clock as an input clock to the one or more scan chains.

14. The system of claim 13, wherein each module comprises an enabling signal input, and wherein the scan controller is to generate an enabling signal to the enabling signal input of each module.

15. The system of claim 13, wherein the clock unit is the other clock unit, and wherein the one or more memory arrays, the clock unit and the one or more logic units are part of one of the one or more modules.

16. The system of claim 7, wherein each logic unit comprises:
a selection logic to select between a functional write enable signal and a scan write enable signal to enable the write access to the respective one memory array; and
another selection logic to select between a functional read enable signal and a scan read enable signal to enable the read access to the respective one memory array, wherein each logic unit to prevent contention of the write access and the read access to the respective one memory array is to prevent assertion of the scan write enable signal and the scan read enable signal simultaneously.

17. A method comprising:
generating a signal having a pulse width of one or more consecutive clock cycles of a module clock;
gating the signal and the module clock to generate an at-speed clock;
generating sequentially, a write enable signal and a read enable signal, to each of a plurality of memory arrays using at least in part the signal, wherein an output of at least one memory array is connected with an input of at least another memory array;
writing data to an address of the at least one memory array responsive to an assertion of the write enable signal; and
reading the data from the address of the one memory array responsive to another assertion of the read enable signal.

18. The method of claim 17, further comprising receiving a pulse selection signal to determine a number of the one or more consecutive clock cycles of the module.

19. The method of claim 17, further comprising selecting one of a scan clock, the at-speed clock and a functional clock as an input clock to one or more logic blocks, each logic block having scan logic.

* * * * *